United States Patent
DiVergilio et al.

(10) Patent No.: US 8,193,513 B2
(45) Date of Patent: Jun. 5, 2012

(54) HYBRID ION SOURCE/MULTIMODE ION SOURCE

(75) Inventors: William F. DiVergilio, Brookline, MA (US); Daniel R. Tieger, Manchester, MA (US); Michael A. Graf, Belmont, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 815 days.

(21) Appl. No.: 12/184,082

(22) Filed: Jul. 31, 2008

(65) Prior Publication Data
US 2009/0032728 A1   Feb. 5, 2009

Related U.S. Application Data

(60) Provisional application No. 60/952,916, filed on Jul. 31, 2007.

(51) Int. Cl.
*H01J 27/00* (2006.01)
(52) U.S. Cl. ................. 250/423 R; 250/427; 250/425
(58) Field of Classification Search .............. 250/423 R, 250/492.2, 427; 376/158
See application file for complete search history.

(56) References Cited

U.S. PATENT DOCUMENTS

| | | | |
|---|---|---|---|
| 5,892,198 A * | 4/1999 | Barnes et al. | 219/121.54 |
| 6,432,260 B1 * | 8/2002 | Mahoney et al. | 156/345.35 |
| 6,661,014 B2 * | 12/2003 | Reyes | 250/423 R |
| 6,693,289 B1 * | 2/2004 | March et al. | 250/492.2 |
| 6,985,553 B2 * | 1/2006 | Leung et al. | 376/158 |
| 2004/0146133 A1 * | 7/2004 | Leung et al. | 376/158 |
| 2006/0169915 A1 | 8/2006 | Olson et al. | |
| 2006/0219938 A1 * | 10/2006 | Huang | 250/432 R |
| 2007/0170372 A1 | 7/2007 | Horsky | |

* cited by examiner

*Primary Examiner* — Nikita Wells
*Assistant Examiner* — Johnnie Smith
(74) *Attorney, Agent, or Firm* — Eschweiler & Associates, LLC

(57) ABSTRACT

A hybrid ion source, comprising a source body configured to create plasma therein, from a first material, wherein the first material comprises one of monatomic gases, small molecule gases, large molecule gases, reactive gases, and solids, a low power plasma generation component operably associated with the source body, a high power plasma generation component operably associated with the source body and an extraction aperture configured to extract ions of the ion plasma from the source body.

10 Claims, 4 Drawing Sheets

HYBRID ION SOURCE/MULTIMODE ION SOURCE

REFERENCE TO RELATED APPLICATION

This application claims priority to and the benefit of U.S. Provisional Application Ser. No. 60/952,916 which was filed Jul. 31, 2007, entitled HYBRID ION SOURCE/MULTI-MODE ION SOURCE, the entirety of which is hereby incorporated by reference as if fully set forth herein.

FIELD OF THE INVENTION

The present invention relates generally to ion implantation systems, and more specifically to a system, apparatus, and method for utilizing multiple modes of operation in a hybrid ion source for ion implantation.

BACKGROUND OF THE INVENTION

In the manufacture of semiconductor devices and further products, ion implantation systems are used to impart dopant elements into semiconductor wafers, display panels, glass substrates, and the like. Typical ion implantation systems or ion implanters implant a workpiece with an ion beam of impurities in order to produce n-type and/or p-type doped regions, or to form passivation layers in the workpiece. When used for doping semiconductors, the ion implantation system injects a selected ion species into the workpiece to produce the desired extrinsic material properties. Typically, dopant atoms or molecules are ionized and isolated, accelerated and/or decelerated, formed into a beam, and implanted into a wafer. The dopant ions physically bombard and enter the surface of the wafer, and subsequently come to rest below the wafer surface.

A typical ion implantation system is generally a collection of sophisticated subsystems, wherein each subsystem performs a specific action on the dopant ions. Dopant elements can be introduced in gas form (e.g., a process gas) or in a solid form that is subsequently vaporized, wherein the dopant elements are positioned inside an ionization chamber and ionized by a suitable ionization process. For example, the ionization chamber is maintained at a low pressure (e.g., a vacuum), wherein a filament, for example is located within the chamber and heated to a point where electrons are emitted from the filament. Negatively-charged electrons from the filament are then attracted to an oppositely-charged anode within the chamber, wherein during the travel from the filament to the anode, the electrons collide with the dopant source elements (e.g., molecules or atoms) and create a plurality of positively charged ions from the source elements. The positively charged ions are subsequently "extracted" from the chamber through an extraction slit via an extraction electrode, wherein the ions are generally directed along an ion beam path toward the wafer.

Typically, a single mode ion source is utilized within an ion implantation system to generate ions of various differing dopant ion species, wherein a change in species (e.g., a change from a first species or process gas to a second reactive species or process cleaning gas) is necessitated in order to perform the specific ion implantations and cleaning of the implantation system. One drawback to using a single mode ion source for implanting various species of ions is that at times it is desirable that the ion source be operated at low density, and therefore low power in order to prevent disassociation of the large molecules utilized within the ion source. Substantial improvements in throughput have been demonstrated for low energy boron implants, for example using large charged ions such as decaborane and octadecaborane. However, at other times, it is desirable to be able to run the ion source at a much higher power in order to run standard implantation gases such as boron trifluoride ($BF_3$), phosphine ($PH_3$) and arsine ($AsH_3$). Thus standard implantation gases are often run at much higher source temperatures. Ion source design for both areas of operation has proven to be problematic.

In addition, it has been found that periodic source cleaning with reactive species such as fluorine is necessary when operating large molecule gases such as decaborane and octadecaborane. Present technology typically uses an external fluorine generator, adding considerable cost and complexity to the system. The external fluorine systems can introduce problems, for example process variability, reduced yields, flow rate issues, and the like.

Accordingly, a need currently exists for a more efficient ion source and apparatus, wherein the ion source can operate in various modes in order to meet more of the needs within the ion implantation industry.

SUMMARY OF THE INVENTION

Accordingly, the present invention overcomes the limitations of the prior art by providing a system, apparatus, and method for efficiently operating an ion source at both a low power dc discharge mode, a high power discharge mode and a high power clean mode. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an ion source utilized in an ion implantation system, wherein the ion source can be transitioned from one power mode to another power mode and from one ion source material to another ion source material in an efficient and timely manner. The ion source is also configured to provide in-situ cleaning. The ion source achieves different power modes by employing a hybrid ion source configured selectively with an RF discharge mode or a DC discharge mode or both within the ionization chamber.

According to one exemplary aspect of the invention, the ion source chamber comprises a housing having one or more sidewalls, wherein an extraction plate is further associated with the housing. The extraction plate, in conjunction with the one or more sidewalls, generally encloses an interior region of the ion source chamber. The extraction plate further comprises an extraction aperture, wherein ions from within the interior region of the ion source chamber are generally extracted therethrough, thus forming an ion beam. One or more inlets are further associated with the housing, wherein the one or more inlets provide a fluid communication between one or more ionizable material sources and the interior region of the ion source chamber. According to one example, an n-type first source material and a p-type second source material are operable to be introduced into the ion source chamber via the one or more inlets.

In another embodiment, the RF heating mode employed within the ionization chamber can be executed utilizing a water cooled RF antenna, for example. The RF antenna can be inductively coupled in order to create plasma within the ionization chamber of the ion source, for example. In addition, the DC discharge mode is carried out utilizing, for example, a cathode heater filament and two repeller plates, one at the filament potential and the other an anode. The RF heating mode and DC discharge mode can be employed together or separately, depending upon the specific application.

According to another exemplary aspect of the invention, one or more material sources are further associated with the ionization chamber, wherein the one or more material source inlets provide a fluid communication between the interior region of the ionization chamber and a region external to the ionization chamber.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
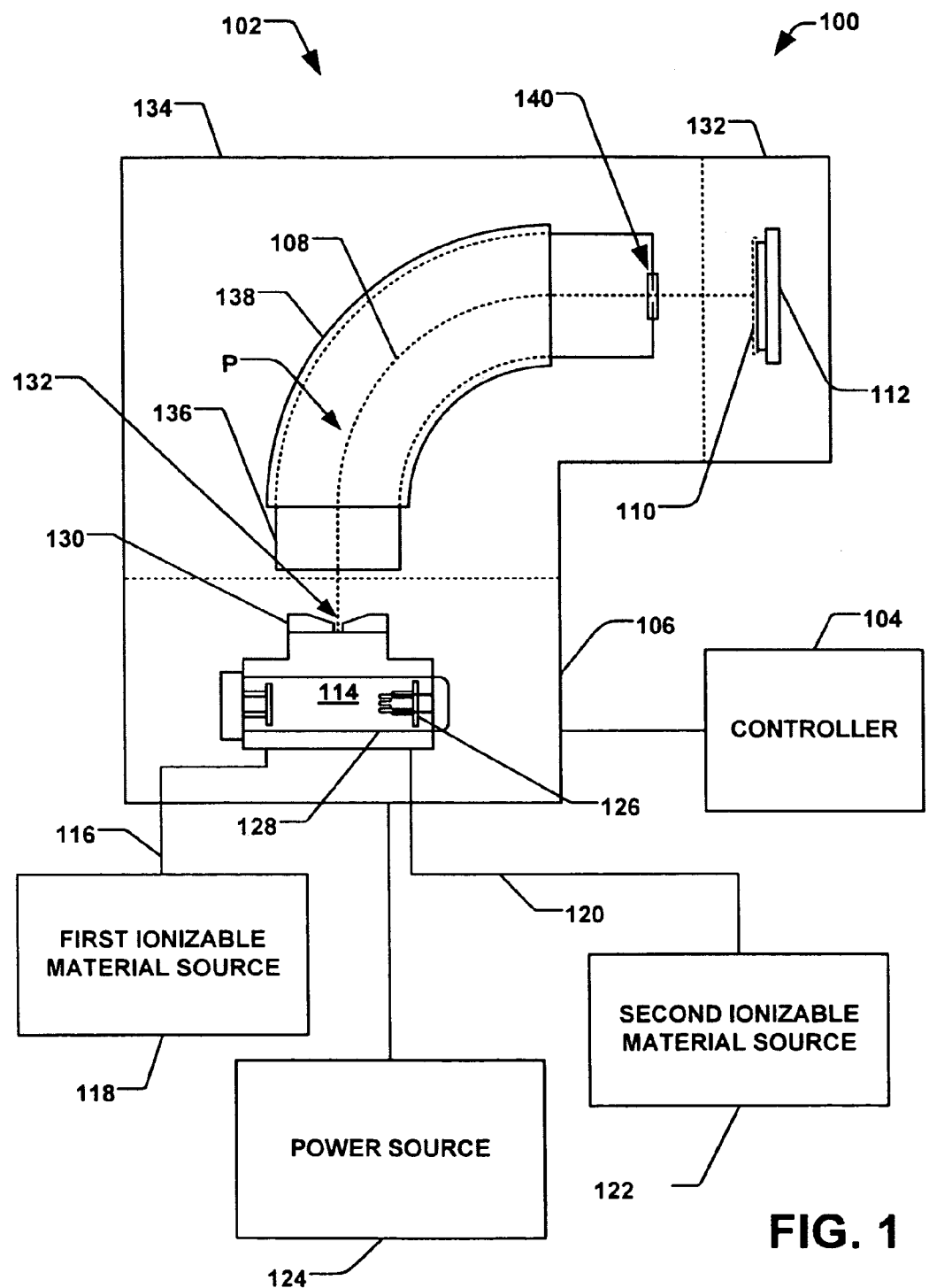
FIG. 1 illustrates a system-level view of an exemplary ion implantation system in accordance with one aspect of the present invention.

The present invention is directed generally towards an improved ion source apparatus, ion implantation system and a cleaning process and method for changing ionization species used in ion implantation. More particularly, the apparatus, system, and method provide rapid change of various discharge modes and source gases utilized in the ion implantation system. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a simplified exemplary ion implantation system 100, wherein the ion implantation system 100 is suitable for implementing one or more aspects of the present invention. It should be noted that the ion implantation system 100 depicted in FIG. 1 is provided for illustrative purposes and is not intended to include all aspects, components, and features of the ion implantation system 100. Instead, the exemplary ion implantation system 100 is depicted so as to facilitate a further understanding of one or more aspects of the present invention.

The ion implantation system 100, for example, comprises an ion implantation apparatus 102 (also referred to as an ion implanter) operably coupled to a controller 104. The controller 104, for example, is operable to substantially control an operation of the ion implantation apparatus 102. The ion implantation apparatus 102, for example, comprises an ion source assembly 106 for producing a quantity of ions operable to travel along an ion beam path P, thus defining an ion beam 108 for implantation of the ions into a workpiece 110 (e.g., a semiconductor wafer, display panel, etc.) held on a wafer platform 112. The ion source assembly 106, for example, comprises an ionization chamber 114, wherein ions are generated from a first ionization material 116 supplied by a first material source 118 or a second ionization material 120 supplied by a second material source 122. In one embodiment the second ionization material 120 can comprise reactive elements used for implantation apparatus cleaning, for example. The charged ions are generally formed within the ionization chamber 114 by an application of power thereto from a power source 124 to either a low power DC discharge device 126 or to a high power RF discharge device 128, or both, for example. The first ionization material 116 and the second ionization material 120 may comprise one or more source materials such as one or more of ionizable dopant gases, vaporized solid source materials, and/or other dopant species that have been previously vaporized. For a p-type implantation to the workpiece 110, for example, the source materials may comprise boron, gallium or indium. For an n-type implantation, the source materials may comprise arsenic, phosphorus, antimony, and the like.

The ion source assembly 106 further comprises an extraction assembly 130 associated therewith, wherein charged ions are extracted through an extraction slit 132 in the ion source chamber 114 via an application of an extraction voltage to the extraction assembly 130. A beamline assembly 134 is further provided downstream of the ion source assembly 106, wherein the beamline assembly 134 generally receives the charged ions. The beam line assembly 134, for example, comprises a beam guide 136, a mass analyzer 138, and a resolving aperture 140, wherein the beam line assembly 134 is operable to form the ion beam shape P.

The mass analyzer 138, for example, further comprises a field generating component, such as a magnet (not shown), wherein the mass analyzer 138 generally provides a magnetic field across the ion beam 108, thus deflecting ions from the ion beam 108 at varying trajectories according to a charge to mass ratio of the ions. For example, ions traveling through the magnetic field experience a force that directs individual ions of a desired charge to mass ratio along the beam path P and deflects ions of undesired charge to mass ratios away from the beam path P. Once through the mass analyzer 138, the ion beam 108 is directed through the resolving aperture 140, wherein the ion beam 108 is selected for implantation into the workpiece 110 positioned within an end station 132.

In accordance with one aspect of the present invention, upon the operation of the ion implantation system 100 to implant ions into the workpiece 110, the dopant species (e.g., the first ionization material 116 or the second ionization material 120) will have a tendency to deposit onto internal surfaces of the ionization chamber 114. Accordingly, when changing between differing dopant species, such as switching from the first ionization material 116 to the second ionization material 120, a transition period is provided (e.g., a predetermined amount of time during which the ion source is operated using the second ionization material 120) in order to allow the deposited materials associated with the first dopant species to be sputtered away from the internal surfaces of the ionization chamber 114 by the second dopant species 120. The second ionization material 120 can be, in one embodiment a reactive material, e.g., nitrogen tri-fluoride ($NF_3$), that can be used to clean the ion implanter in situ, without requiring an externally supplied cleaning system, for example. The fluoride radicals generated in the plasma can be employed to chemically clean the ion source assembly 106 internal surfaces. Such a transition period is well known in the art, and is typically utilized to "purge" or "clear" conventional ion source chambers by expelling the undesired sputtered species through the extraction slit 140.

Providing such a high power and low power ionization chamber 114 generally allows, for example, the deposited materials of the previous dopant species to exit the ion source 106 chamber more rapidly, wherein the deposited materials advantageously diffuse through the extraction assembly 130, as well as exiting via the extraction slit 132. Such diffusion generally allows for faster changes between particular dopant species, increasing both stability and auto-tune times for the ion implantation system 100.

While not illustrated in FIG. 1, the apparatus further comprises a controller that is configured to selectively activate and deactivate the low power discharge device 126 and the high power discharge device 128 based on a desired operating mode.

Figure 2:
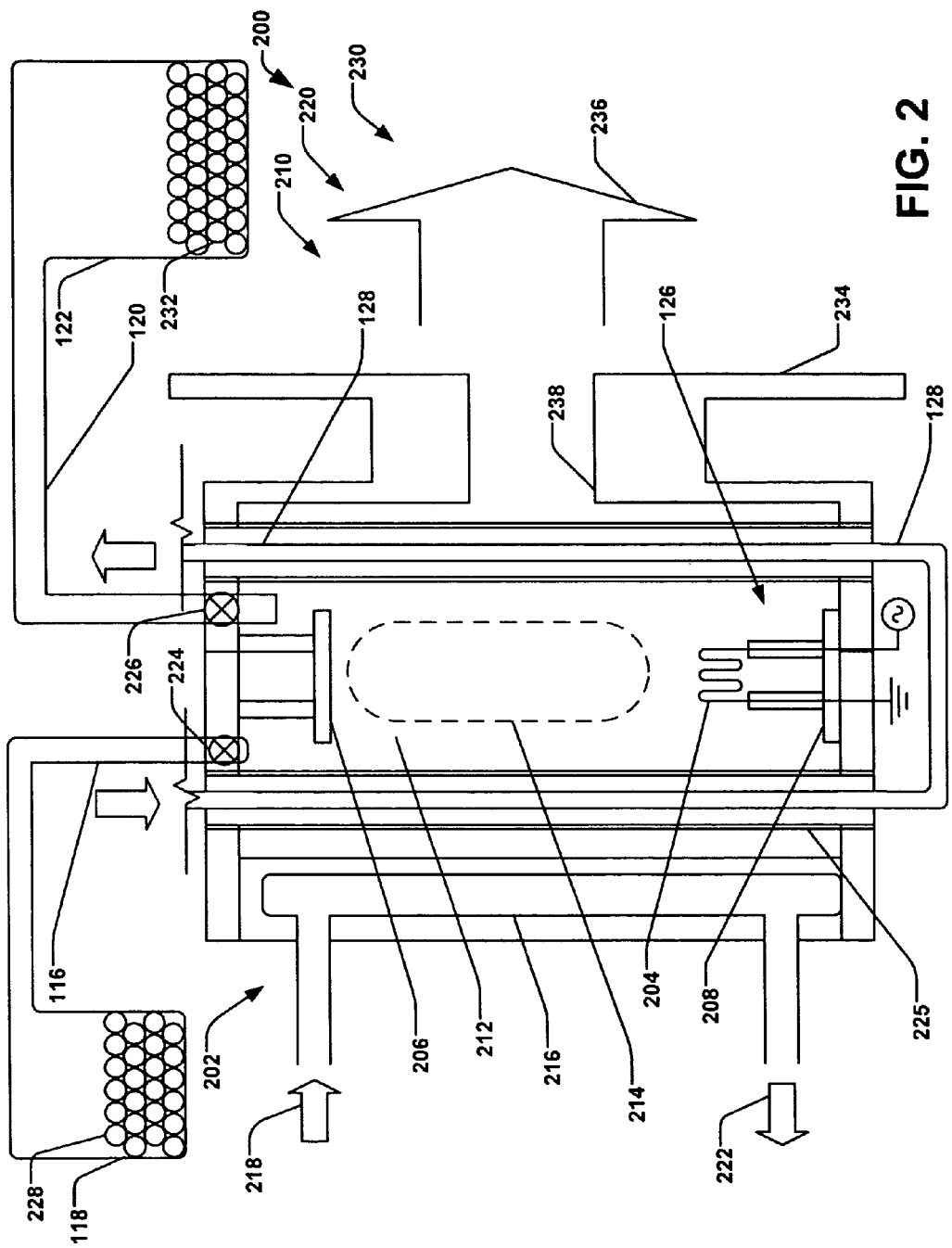
FIG. 2 is a schematic of an exemplary ion source according to another aspect of the present invention.

FIG. 2 illustrates a simplified schematic of the exemplary ion source assembly 200 shown in FIG. 1 as 106, wherein several exemplary aspects of the present invention are further presented. The ion source assembly 200 comprises an ion source assembly body 202, with an ionization chamber configured to create plasma 214 in a region between a filament 204 and a repeller plate 206 and between the arms of an RF antenna 128. The antenna 128 is water cooled, for example, and can be made of copper, and the like, surrounded by a ceramic tube 225, e.g., sapphire. The ion source assembly body 202 can be water cooled (or another fluid) by employing a water jacket 216 with water flowing in 218 and water flowing out 222 of the water jacket as shown, for example. The ion source chamber 212 of FIG. 2, for example, comprises both a low power DC discharge component 126 therein, and the high power discharge component, the RF antenna 128. In the present example, the low power discharge component 126 comprises a cathode heater filament 204, a first repeller plate 206 and a second repeller plate 208. The ionization chamber 212 is fed with ionization material 116 and 120, as discussed supra that can be controlled by a first valve 224 or a second valve 226, or both. Solid or gaseous ionization material is illustrated as 228 and 232, respectively. In one example, a number of n-type ion implantations can be repeatedly performed using the ion implantation system 100 of FIG. 1, wherein the first ionization material 116 is utilized for the ion implantation from a first material source 118, and a subsequent change to a p-type implantation is desired using the second ionization material 120 from the second material source 122. The repeated ion implantations using the first ionization material 116, however, can deposit dopant material onto the internal surfaces of the ion source chamber 114 of FIG. 2. Accordingly, a transition period is provided, wherein the deposited material associated with the first ionization material 116 is generally removed from the ion source chamber 212 via the second ionization material 120 (e.g., fluorine), and wherein the system 200 of FIG. 2 is stabilized prior to implanting ions into the wafer 110 (FIG. 1) with the p-type second dopant species, for example. The inventors recognized the advantage of having a cleaning component present in situ rather than supplying an external cleaning system. In the present example, a pump (not shown) can be utilized to facilitate the transition between the first ionization material 116 and the second ionization material 120 of FIG. 2, as well as to provide a substantial vacuum pressure within the ion source chamber 212.

Furthermore, in the present example, the inventors recognized the advantages of operating the ion source 200 in at least three separate modes comprising: a low power mode 210, a standard high power mode 220, and a high power clean mode 230. Low power mode 210 involves ion source assembly 202 generation involving large molecule gases such as decaborane ($B_{10}H_{14}$), octadecaborane ($B_{18}H_{22}$), and the like, with typical extraction currents of less than 10 milliamps. The low discharge power mode 210 can be employed to prevent disassociation of the large molecules mentioned supra. In one embodiment a maximum discharge power of around 5 Watts, approximately 100 volts or less and a maximum 50 mA cathode current are employed.

Standard high power mode 220 involves, for example, ion source assembly operation with monatomic molecular gases and small gases typical in ion implantation. The monatomic gases comprise at least one of the following: boron (B), cobalt (Co), Argon (Ar), titanium (Ti), oxygen (O) and phosphorus (P). The small molecular gases can include at least one of the following: silicon germanium (SiGe), boron tri-fluoride ($BF_3$), phosphorus hydride ($PH_3$), Arsine ($AsH_3$), germanium tetrafluoride ($GeF_4$), silicon tetrafluoride ($SiF_4$), phosphorous trifluoride ($PF_3$), and the like. The monatomic gases and small molecular gases used in ion implantation are well known by those of ordinary skill in the art.

The high power clean mode 230 is configured wherein the ion source operates with the reactive gases, such as, nitrogen trifluoride ($NF_3$), for example. The fluoride radicals generated in the plasma act to chemically clean the source 202 internal walls, optics, and the like. The clean mode 230 is operated in one embodiment without ion beam extraction. The discharge power would typically be in the same range as the standard high power mode, but the gas pressure would likely be higher, on the order of approximately 100 mTorr, or more. Ions 236 are shown leaving the ion source assembly through an aperture 238 in FIG. 2, wherein they can enter the beam guide 136 (FIG. 1), for example.

Figure 3:
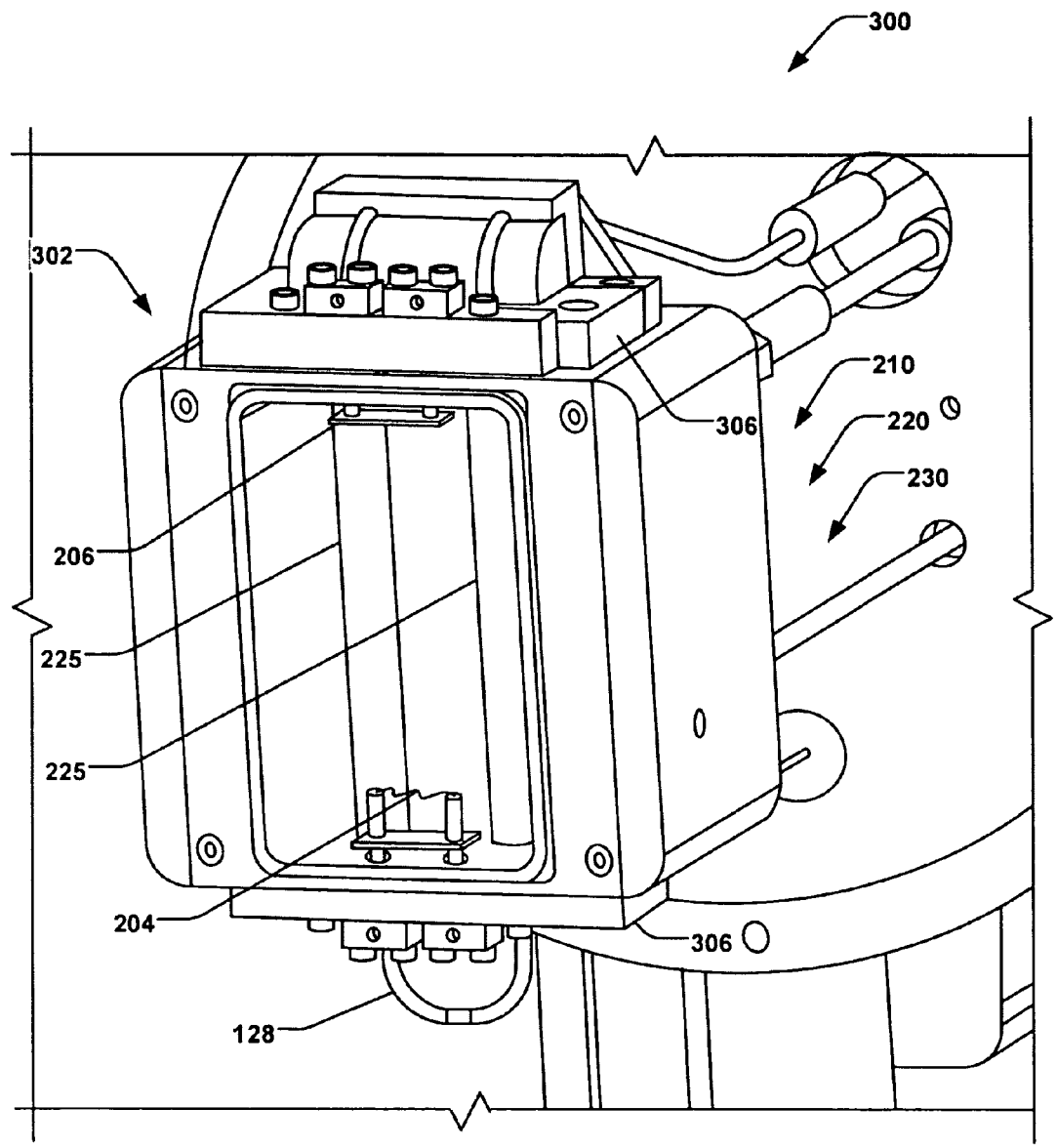
FIG. 3 is a side perspective view of an exemplary ion source according to another aspect of the present invention.

FIG. 3 illustrates a perspective view of an exemplary ion source assembly 302 employed with an RF ion source 300 with an extraction aperture removed. The exemplary ion source body assembly, for example, comprises the ion source body 302 wherein an RF antenna 128 resides, within sapphire tubes 225 that enclose the RF antenna 128 within a plasma chamber and provide a circumferential gap between the outside of the antenna 128 and the inside of the sapphire tube 225. It is to be appreciated that the ion source body 302 can utilize other materials than sapphire for the tube 225, for example, quartz, Boron Nitride, and other refractory dielectrics.

The antenna 128 can be precisely located in one embodiment by employing antenna support plates 306 at the top and bottom of the ion source body 302. The plates 306 can be located precisely by utilizing, for example, alignment pins (not shown). The plates 306, for example, can be manufactured from machinable ceramics, aluminum with ceramic inserts, and the like. The Sapphire tubes 225 can have the ends ground precisely and fit up into precision holes in the ion source body 302 or precision inserts. The configuration, e.g., of the 3.18 mm (⅛ inch) O.D., Copper tube, antenna 225 and the 8 mm ID Sapphire tubes provides a vacuum gap for thermal isolation of 2.41 mm. In addition, the Sapphire tubes 225 may not need to provide a hermetic seal, but rather, may be designed to limit the gas flow out of the source in one embodiment.

Additionally, the ion source assembly 300 in FIG. 3 comprises an ion source assembly body 302, with an ionization chamber configured to create ion plasma in a region between a filament 204 and a repeller plate 206 and between the two arms of the RF antenna 128 within the plasma chamber.

In accordance with the present invention, the ion source assembly 300 can be run in at least three different modes. As discussed supra, a first mode is a low power mode 210, a second mode 220 is standard high power mode, and a third mode is high power clean mode 230. The first low power mode 210 of operation involves ion generation involving large molecule gases such as decaborane ($B_{10}H_{14}$), octadecaborane ($B_{18}H_{22}$), and the like, with extraction currents of less than 10 milliamps, for example. The low discharge power mode 210 is required to prevent disassociation of the large molecules mentioned supra. During low power mode 210 a typical cathode voltage will be approximately 50-100 VDC and a typical cathode current can be 50-100 milliamps ADC, for example. Since the maximum cathode current is much smaller than the maximum current in a typical ion implantation source, the cathode area may be much smaller, less than $1/10$ a typical area. This will greatly reduce the problem of disassociation of large molecules on the cathode. Furthermore, the heat load on the source will be similarly reduced, alleviating the problem of molecular disassociation on the walls.

The standard high power mode 220 involves ion source assembly operation with monatomic gases and small molecular gases typical in ion implantation. The monatomic gases comprise at least of the following: boron (B), cobalt (Co), Argon (Ar), titanium (Ti), oxygen (O) and phosphorus (P). The small molecular gases can include at least one of the following: silicon germanium (SiGe), boron tri-fluoride ($BF_3$), phosphorus hydride ($PH_3$), Arsine ($AsH_3$), germanium tetrafluoride ($GeF_4$), silicon tetrafluoride ($SiF_4$), phosphorous trifluoride ($PF_3$), and Arsine ($AsH_3$) and the like. The monatomic gases and small molecular gases used in ion implantation are well known by those of ordinary skill in the art. RF discharge and DC discharge will involve mostly the discharge power of the RF antenna 128. The function of the DC discharge is to facilitate rapid initiation of the RF discharge in one embodiment. Pure RF discharge can be difficult to start, as an outside source of electrons is required. In pure RF discharge, the source may be natural radiation or a spark between the source electrodes and this situation can result in unreliable starting. The DC discharge provides a reliable source of electrons, resulting in fast, reproducible startup. This may be advantageous in some types of source operations, e.g., repaint schemes.

In this mode of operation 220, the cathode voltage may be much less than that of the typical cathode in the low power mode 210 as the DC discharge is needed primarily to supply electrons and not electron energy. Reduction of the cathode voltage in this mode will reduce the cathode erosion rate by sputtering in the high power mode 220.

The high power clean mode 230 in one embodiment utilizes RF discharge only and is configured wherein the ion source operates with the reactive gases, such as, nitrogen trifluoride ($NF_3$), for example. The fluoride radicals generated in the plasma act to chemically clean the source 302 internal walls, optics, and the like. As the source pressure is high in this mode 230, approximately 100 mTorr, the startup of the RF discharge is easier, and the filament cathode may be turned off. If the cathode is necessary for start up, it should be immediately shut off after initiation to minimize erosion in the high-pressure discharge. The clean mode 203 is operated without ion beam extraction in one embodiment. The discharge power would typically be in the same range as the standard high power mode 220, but the gas pressure would likely be higher as mentioned supra, of the order of approximately 100 mTorr, or higher.

Figure 4:
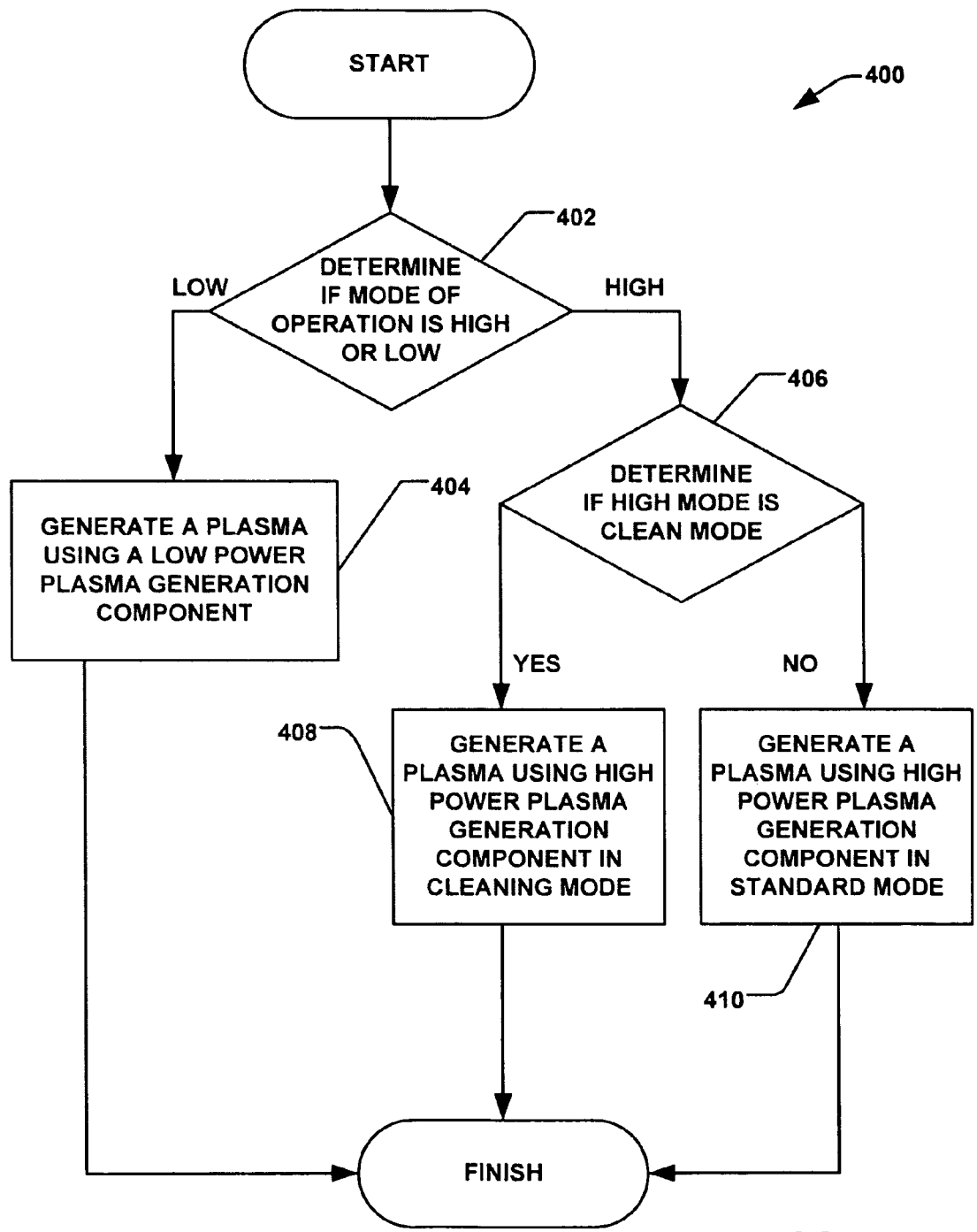
FIG. 4 is a block diagram of an exemplary method for changing modes in an ion source according to another exemplary aspect of the invention.

In accordance with another aspect of the present invention, FIG. 4 illustrates a method 400 for determining whether to generate a plasma using low or high power mode within an ion implantation system. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 4, the method 400 begins with determining if the mode of operation is a low power mode or a high power mode, wherein the ion source chamber comprises an RF antenna 128 (high power device) (see FIG. 2) and a cathode filament 204 with a repeller plate 206 (low power device) (see FIG. 2) associated therewith. The ionization chamber 212, for example, can be utilized in an ion implantation system, such as the ion implantation system 100 of FIG. 1. At 402 of FIG. 4, if it is determined that the operating mode is low power the method proceeds to 404, wherein a plasma is generated within the ionization chamber using the low power device. The plasma is formed within the ion source chamber 212, utilizing a cathode current of approximately 50-100 mA DC and a voltage in the range of about 50-100 VDC. The method 400 then ends if the operation was low power mode operation.

At 402 if it is determined that the mode of operation is high power then the method proceeds to 406, wherein it is determined whether or not the mode is a high power clean mode. If the mode is a high power cleaning mode (YES) the method continues to 408, wherein the ion source can operate in RF discharge only using the high power device. The source of pressure is high in this mode (approximately 100 mTorr or greater) and therefore the start up of the RF discharge is easier and the filament cathode can remain off. If it is determined that the cathode is necessary or advantageous for start up, the lower power device can be momentarily employed and can then be immediately shut off after initiation in order to minimize erosion in the high-pressure discharge area.

At 406 if it is determined that the mode of operation is standard high power (NO), then both the high power and low power device (RF and DC discharge) will be utilized. The majority of the power will come from the RF antenna and the function of the DC discharge will be to initiate rapid RF discharge as discussed supra. From there the method is complete.

Although the invention has been described with respect to certain preferred embodiments, it is obvious that equivalent alterations and modifications can and will occur to others skilled in the art upon the reading and understanding of this specification and annexed drawings. In particular regard to various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given application.

What is claimed is:

1. A hybrid ion source, comprising:
   a source body configured to create ion plasma therein from a first material, wherein the first material comprises one of monatomic gases, small molecule gases, large molecule gases, reactive gases, and solids;
   a low power plasma generation component operably associated with the source body;
   a high power plasma generation component operably associated with the source body;
   an extraction aperture configured to extract ions of the ion plasma from the source body; and
   a controller configured to selectively activate the low power plasma generation component and the high power plasma generation component based on a selected mode of operation, wherein when the selected mode of operation is a low power mode, only the low power plasma generation component is activated, wherein when the selected mode of operation is a high power clean mode, only the high power plasma generation component is activated, and wherein when the selected mode of operation is a standard high power mode, both the high power plasma generation component and low power plasma generation component are activated.

2. The hybrid ion source of claim 1, wherein the low power plasma generation component comprises a cathode heater filament, a repeller plate at a filament potential and an anode.

3. The hybrid ion source of claim 1, wherein the high power plasma generation component comprises an RF antenna.

4. The hybrid ion source of claim 3, wherein the RF antenna is water cooled.

5. The hybrid ion source of claim 3, wherein the RF antenna is at least partially surrounded by an insulative tube.

6. The hybrid ion source of claim 1, wherein the monatomic gases comprise one of the following: boron (B), cobalt (Co), argon (Ar), titanium (Ti), oxygen (O) and phosphorus (P).

7. The hybrid ion source of claim 1, wherein the small molecule gases comprise one of the following: germanium tetrafluoride ($GeF_4$), silicon tetrafluoride ($SiF_4$), boron trifluoride ($BF_3$), phosphorous trifluoride ($PF_3$), Phosphine ($PH_3$), and Arsine ($AsH_3$).

8. The hybrid ion source of claim 1, wherein the reactive gases comprise one of the following: oxygen ($O_2$), fluorine ($F_2$), and $NF_3$.

9. The hybrid ion source of claim 1, wherein the large molecule gases comprise one of the following: decaborane ($B_{10}H_{14}$), octadecaborane ($B_{18}H_{22}$).

10. The hybrid ion source of claim 1, further comprising an extraction apparatus associated with the extraction aperture, wherein the extraction apparatus is operable to extract ions from the source body through the extraction aperture to generally form an ion beam associated with the beam path region.

* * * * *